(12) United States Patent
Adriaens et al.

(10) Patent No.: US 11,940,264 B2
(45) Date of Patent: Mar. 26, 2024

(54) MIRROR CALIBRATING METHOD, A POSITION MEASURING METHOD, A LITHOGRAPHIC APPARATUS AND A DEVICE MANUFACTURING METHOD

(71) Applicant: ASML NETHERLANDS B.V., Veldhoven (NL)

(72) Inventors: Johannes Mathias Theodorus Antonius Adriaens, Eindhoven (NL); Carolus Johannes Catharina Schoormans, Hooge Mierde (NL); Luuk Johannes Helena Seelen, Vlodrop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 344 days.

(21) Appl. No.: 17/624,276

(22) PCT Filed: Jun. 5, 2020

(86) PCT No.: PCT/EP2020/065651
§ 371 (c)(1),
(2) Date: Dec. 31, 2021

(87) PCT Pub. No.: WO2021/004709
PCT Pub. Date: Jan. 14, 2021

(65) Prior Publication Data
US 2022/0357147 A1   Nov. 10, 2022

(30) Foreign Application Priority Data
Jul. 5, 2019   (EP) ..................... 19184747

(51) Int. Cl.
*G01B 11/00*   (2006.01)
*G03F 7/00*   (2006.01)

(52) U.S. Cl.
CPC ........ *G01B 11/005* (2013.01); *G03F 7/70775* (2013.01); *G03F 7/7085* (2013.01)

(58) Field of Classification Search
CPC .. G01B 11/005; G01B 11/00; G01B 9/02027; G03F 7/70775; G03F 7/7085
See application file for complete search history.

(56) References Cited

U.S. PATENT DOCUMENTS 6,020,964 A   2/2000   Loopstra et al.
6,495,847 B1 *   12/2002   Asano .................. G03F 9/70
                                                             250/548

(Continued)

FOREIGN PATENT DOCUMENTS

JP   2007116143   5/2007
JP   2007534941   11/2007

(Continued)

OTHER PUBLICATIONS

Office Action issued in corresponding Japanese Patent Application No. 2021-574342, dated Feb. 24, 2023.

(Continued)

*Primary Examiner* — Peter B Kim
(74) *Attorney, Agent, or Firm* — Pillsbury Winthrop Shaw Pittman, LLP

(57) ABSTRACT

A method for calibrating a mirror of an interferometer system configured to measure a position of an object using two interferometers of the interferometer system that are arranged at opposite sides of the object and configured to measure the position of the object in the same X-direction, wherein two sets of measurements are obtained for different rotational orientations about an axis perpendicular to the X-direction to determine a shape of the mirror. There is also provided a position measuring method in which the obtained shape of the mirror is used to adjust measurements in the (Continued)

X-direction, a lithographic apparatus and a device manufacturing method making use of such a lithographic apparatus.

20 Claims, 5 Drawing Sheets

(56) References Cited

U.S. PATENT DOCUMENTS

| | | | |
|---|---|---|---|
| 6,952,253 | B2 | 10/2005 | Lof et al. |
| 2005/0219486 | A1* | 10/2005 | Korenaga ........... G03F 7/70775 355/53 |
| 2005/0237536 | A1 | 10/2005 | Hill et al. |
| 2007/0058173 | A1 | 3/2007 | Holzapfel |
| 2007/0070313 | A1 | 3/2007 | Eussen |
| 2008/0304050 | A1 | 12/2008 | Kurosawa |

FOREIGN PATENT DOCUMENTS

| | | |
|---|---|---|
| JP | 2008306140 | 12/2008 |
| JP | 2009302490 | 12/2009 |
| JP | 2010087310 | 4/2010 |
| WO | 2018010961 | 1/2018 |

OTHER PUBLICATIONS

International Search Report and Written Opinion issued in corresponding PCT Patent Application No. PCT/EP2020/065651, dated Sep. 9, 2020.

* cited by examiner

MIRROR CALIBRATING METHOD, A POSITION MEASURING METHOD, A LITHOGRAPHIC APPARATUS AND A DEVICE MANUFACTURING METHOD

CROSS-REFERENCE TO RELATED APPLICATION

The application is the U.S. national phase entry of PCT Patent Application No. PCT/EP2020/065651 which was filed on Jun. 5, 2020, which claims the benefit of priority of European Patent Application No. 19184747.4 which was filed on Jul. 5, 2019 and which is incorporated herein in its entirety by reference.

FIELD

The present invention relates to a method for calibrating a mirror of an interferometer system configured to measure a position of an object. The invention further relates to a method for measuring a position of an object using an interferometer system, a lithographic apparatus and a device manufacturing method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Lithographic apparatus usually comprise positioning systems to position an object, wherein use is made of an interferometer system configured to measure a position of the object. In a possible configuration of the interferometer system, a first interferometer is arranged to provide a first position signal representative of a position of the object in X-direction by directing a first measurement beam on a first mirror, and a second interferometer is arranged to provide a second position signal representative of the position of the object in X-direction by directing a second measurement beam on a second mirror, wherein the first mirror and the second mirror are arranged on opposite sides of the object and mainly extend in a Y-direction.

The first and second mirror in general do not define perfectly flat mirror surfaces and/or do not extend perfectly in Y-direction. For applications in which accurate measurements of the position of the object are necessary, the imperfect first and second mirror may prevent carrying out such accurate measurements or can be seen as disturbances on the first and second position signal, respectively. Hence, it may be desired to calibrate the first and/or second mirror and to use the calibrations, e.g. in the form of a mirror map, to compensate the first and second position signals for the imperfect first and/or second mirror.

The first and second interferometer can be used in calibrating the first and second mirror, but a drawback of the first and second interferometer being arranged at opposite sides of the object is that the first and second position signals only provide information on symmetrical shapes of the first and second mirror and no or hardly any information on asymmetrical shapes. Hence, it is not possible to fully reconstruct the mirror shapes of the first and/or second mirror using the first and second interferometer.

SUMMARY

Considering the above, it is an object of the invention to provide a method to fully reconstruct the mirror shapes of the first and second mirror of a first and second interferometer, respectively, using the first and second interferometer.

According to an embodiment of the invention, there is provided a method for calibrating a mirror of an interferometer system configured to measure a position of an object, which interferometer system includes a first interferometer and a second interferometer, wherein the first interferometer is arranged to provide a first position signal representative of a position of the object in X-direction by directing a first measurement beam on a first mirror, wherein the second interferometer is arranged to provide a second position signal representative of the position of the object in X-direction by directing a second measurement beam on a second mirror, wherein the first mirror and the second mirror are arranged on opposite sides of the object and extend in a Y-direction, wherein the method comprises the following steps:

a. generating a first data set comprising the first position signal and the second position signal for each of a plurality of positions of the object in the Y-direction while the object is in a first rotational orientation and in a first position in a Z-direction;

b. tilting the object to a second rotational orientation about a rotation axis perpendicular to the X-direction;

c. generating a second data set comprising the first position signal and the second position signal for each of a plurality of positions of the object in the Y-direction while the object is in the second rotational orientation and in the first position in the Z-direction; and d. determining a shape of the first mirror and/or a shape of the second mirror in the Y-direction based on the first data set and the second data set.

An advantage of this method is that due to tilting the object the location where the first measurement beam hits the first mirror and the location where the second measurement beam hits the second mirror shift opposite to each other thereby allowing to obtain information about the asymmetrical shapes as well. Hence, the measurements in the first rotational orientation combined with the measurements in the second rotational orientation allows to provide information about both the symmetrical shapes and the asymmetrical shapes and thus allow to fully construct the shape of the first mirror and/or the shape of the second mirror.

During step a., the plurality of positions of the object in the Y-direction results in a first pairing configuration in the first data set between measurement locations on the first mirror and measurement locations on the second mirror. Due to the tilting in step b., the second data set will comprise a second pairing configuration between measurement locations on the first mirror and measurement locations on the second mirror, which second pairing configuration is different from the first pairing configuration and may thus result in different position signals for the corresponding measurement locations providing additional information about the mirror shapes.

In an embodiment, the plurality of positions of the object in Y-direction used in step c. is chosen such that the second data set comprises measurement locations on the first and second mirror that are also in the first data set (but in a first pairing configuration instead of the second pairing configuration as in the second data set).

In an embodiment, the at least one of the first and second interferometer is a multi-pass interferometer. A multi-pass interferometer directs the measurement beam multiple times towards the associated mirror before interfering with a reference beam. An advantage of a multi-pass interferometer is that the effect of the tilting of the object on the shift in position of the measurement beam on the respective mirror is larger compared to a single-pass interferometer.

In an embodiment, step d. comprises comparing a value of the first data set at one of the plurality of positions of the object in the Y-direction with a value of the second data set at the one of the plurality of positions of the object in the Y-direction.

In an embodiment, step d. comprises solving a linear least squares system build from the first data set and the second data set.

In an embodiment, step d. comprises a linear least squares system incorporated into a non-linear least squares solver, wherein for each iteration, a value for pitch errors of the first and/or second interferometer is determined resulting in an update of the linear system, and wherein the linear system is solved once the pitch error values converge.

In an embodiment, tilting the object to the second rotational orientation results in a shift in measurement location of other position sensors, e.g. interferometers, that are used as a reference. For instance in respect of an interferometer measuring a position of the object in Y-direction. In such a case, it may be possible to add a translation of the object to compensate for the shift in measurement location during step b.

In an embodiment, the rotation axis perpendicular to the X-direction is perpendicular to the Y-direction, i.e. the rotation axis is parallel to the Z-direction. This is particular useful when calibration is mainly needed in the Y-direction.

In an embodiment, the rotation axis perpendicular to the X-direction is parallel to the Y-direction, i.e. the rotation axis is perpendicular to the Z-direction. This is particular useful when calibration is mainly needed in the Z-direction.

In an embodiment, the steps prior to step d. are repeated for a second position of the object in Z-direction, such that the first data set also comprises the first position signal and the second position signal for each of the plurality of positions of the object in the Y-direction while the object is in the first rotational orientation and in the second position, and such that the second data set also comprises the first position signal and the second position signal for each of the plurality of positions of the object in the Y-direction while the object is in the second rotational orientation and in the second position, and wherein in step d. the first data set and the second data set are further used to determine a shape of the first mirror and/or the second mirror in Z-direction. This is particular useful when calibration is needed in both the Y-direction and the Z-direction.

In an embodiment, the method further comprises the steps of:
tilting the object about a further rotation axis extending parallel to the Y-direction; and
repeating the steps prior to step d, such that the first data set also comprises the first position signal corresponding to the first position in the Z-direction for each of the plurality of positions of the object in the Y-direction and the second position signal corresponding to the second position in the Z-direction for each of the plurality of positions of the object in the Y-direction while the object is in the first rotational orientation, and such that the second data set also comprises the first position signal corresponding to the first position in the Z-direction for each of the plurality of positions of the object in the Y-direction and the second position signal corresponding to the second position in the Z-direction for each of the plurality of positions of the object in the Y-direction while the object is in the second rotational orientation.

An advantage of tilting the object about the further rotation axis is that the location where the first measurement beam hits the first mirror and the location where the second measurement beam hits the second mirror shift opposite relative to each other in the Z-direction thereby providing additional information to reconstruct the shape of the first mirror and/or the shape of the second shape in the Z-direction.

In an embodiment, the interferometer system includes a third interferometer, wherein the third interferometer is arranged to provide a third position signal representative of the position of the object in X-direction by directing a third measurement beam on the first mirror, wherein the combination of the first and the third interferometer allows to measure a rotation of the object about an axis extending parallel to the Z-direction, and wherein the method prior to step d. comprises the following step of generating a third data set comprising the first position signal and the third position signal for each of a plurality of positions of the object in the Y-direction while the object is maintained in a constant rotational orientation about said axis parallel to the Z-direction using other sensors than the first, second and third interferometer, and wherein in step d. the third data set is used to determine the shape of the first mirror in Y-direction. An advantage is that a redundancy in the measurements in the X-direction due to the first and second interferometer is combined with a redundancy in the measurements in a rotational direction about the axis extending parallel to the Z-direction due to the first and second interferometer and the other sensors.

In an embodiment, the interferometer includes a further interferometer, wherein the further interferometer is arranged to provide a further position signal representative of the position of the object in both X- and Z-direction by directing a further measurement beam via a further mirror on the object to an external mirror, wherein the further mirror on the object extends in Y-direction and makes a non-zero angle with both the X- and Y-direction, wherein the further mirror is calibrated along with the first mirror for the purpose of increasing an accuracy of position measurements in Z-direction obtained using the further position signal and the first position signal.

According to another embodiment of the invention, there is provided a method for measuring a position of an object using an interferometer system including a first interferometer, the first interferometer being a multi-pass interferometer having a first optical system and a first mirror, wherein the first optical system is configured to direct a first measurement beam towards the first mirror such that the first measurement beam is incident to the first mirror at at least two distinct measurement locations, wherein the first mirror is arranged on the object and mainly extends in a Y-direction to allow the first interferometer to measure a position of the object in an X-direction perpendicular to the Y-direction, wherein the method makes use of a mirror map including data representative for the shape of the first mirror in the Y-direction, and wherein the method comprises the following steps:

a. measuring a position of the object in the Y-direction;
b. measuring a rotational position of the object about an axis extending parallel to a Z-direction, which Z-direction is perpendicular to both the X-direction and the Y-direction;
c. using the measured position in the Y-direction and the measured rotational position about the axis parallel to the Z-direction to determine the position of the at least two distinct measurement locations of the first measurement beam on the first mirror in the Y-direction;
d. measuring a position of the object in the X-direction; and
e. using the mirror map and the determined positions of the at least two distinct measurement locations to adjust the measured position of the object in the X-direction for the shape of the first mirror.

An advantage of this method is that the adjustment of the measured position of the object in the X-direction takes a shift of the two distinct measurement locations due to a tilt about the axis extending parallel to the Z-direction into account.

In an embodiment, the interferometer includes a second interferometer, the second interferometer being a multi-pass interferometer having a second optical system and a second mirror, wherein the second optical system is configured to direct a second measurement beam towards the second mirror such that the second measurement beam is incident to the second mirror at at least two distinct measurement locations, wherein the second mirror is arranged on the object at a side opposite to the first mirror and mainly extends in the Y-direction to allow the second interferometer to measure a position of the object in the X-direction, and wherein the mirror map is obtained using a method for calibrating the first mirror according to the invention as described above.

In an embodiment, the mirror map includes data representative for the shape of the first mirror in the Z-direction, and wherein the method prior to step e. includes the following steps:

measuring a position of the object in the Z-direction;
measuring a rotational position of the object about an axis extending parallel to the Y-direction; and
using the measured position in the Z-direction and the measured rotational position about the axis parallel to the Y-direction to determine the position of the at least two distinct measurement locations of the first measurement beam on the first mirror in the Z-direction.

An advantage is that the adjustment of the measured position of the object in the X-direction also takes a shift of the two distinct measurement locations due to a tilt about the axis extending parallel to the Y-direction into account.

In an embodiment, the mirror map is obtained using a method for calibrating the first mirror in both the Y-direction and the Z-direction according to the invention as described above.

According to yet another embodiment, there is provided a lithographic apparatus comprising:

an object to be positioned;
an actuator system to position the object;
a measurement system including an interferometer system, which interferometer system includes a first interferometer and a second interferometer, wherein the first interferometer is arranged to provide a first position signal representative of a position of the object in X-direction by directing a first measurement beam on a first mirror, wherein the second interferometer is arranged to provide a second position signal representative of the position of the object in X-direction by directing a second measurement beam on a second mirror, wherein the first mirror and the second mirror are arranged on opposite sides of the object and mainly extend in a Y-direction; and
a control system to drive the actuator system based on an output of the measurement system, wherein the control system is configured to carry out the method for calibrating a mirror of the interferometer system according to the invention as described above.

In an embodiment, the lithographic apparatus further comprises:

an illumination system configured to condition a radiation beam;
a support constructed to support a patterning device, the patterning device being capable of imparting the radiation with a pattern in its cross-section to form a patterned radiation beam;
a substrate table constructed to hold a substrate; and
a projection system configured to project the patterned radiation beam onto a target portion of the substrate, wherein the object is the support or the substrate table.

In an embodiment, the Y-direction is a scan direction.

According to a further embodiment, there is provided a device manufacturing method wherein use is made of a lithographic apparatus according to the invention as described above.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
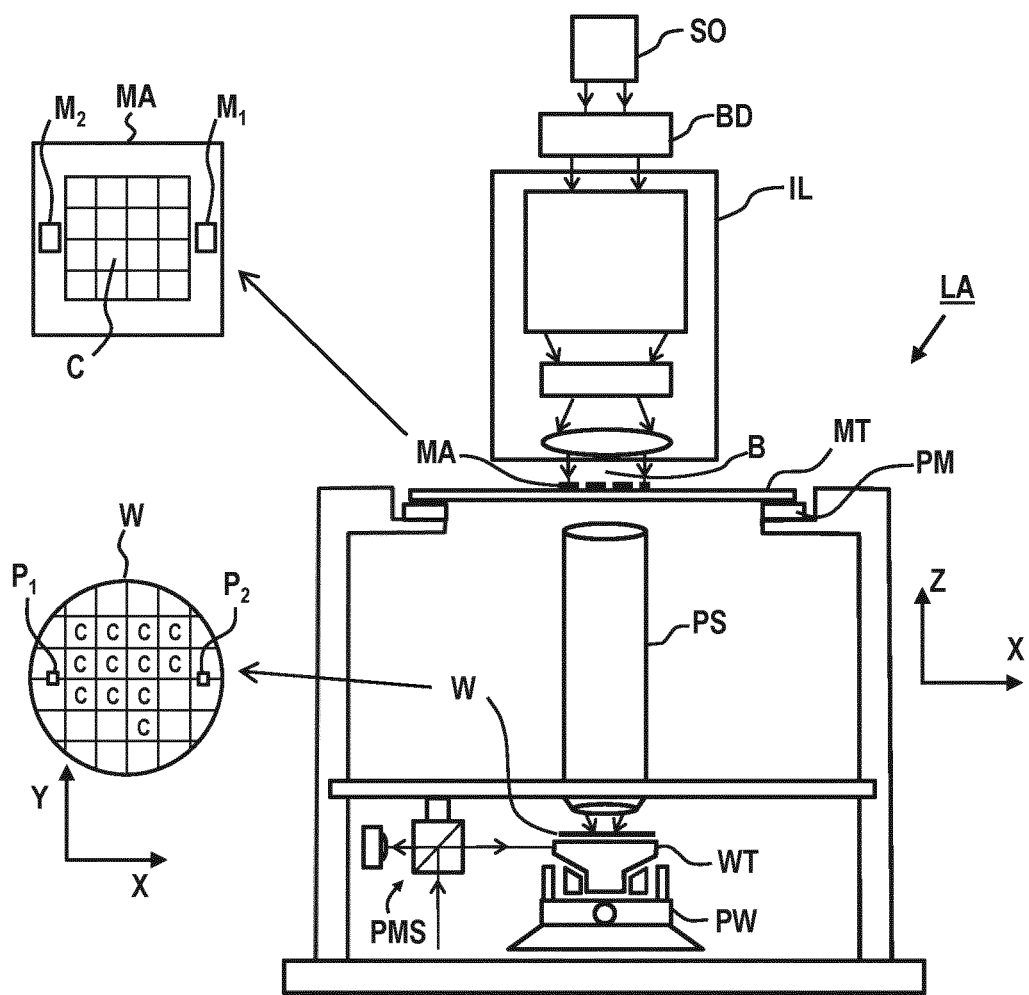
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axis is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
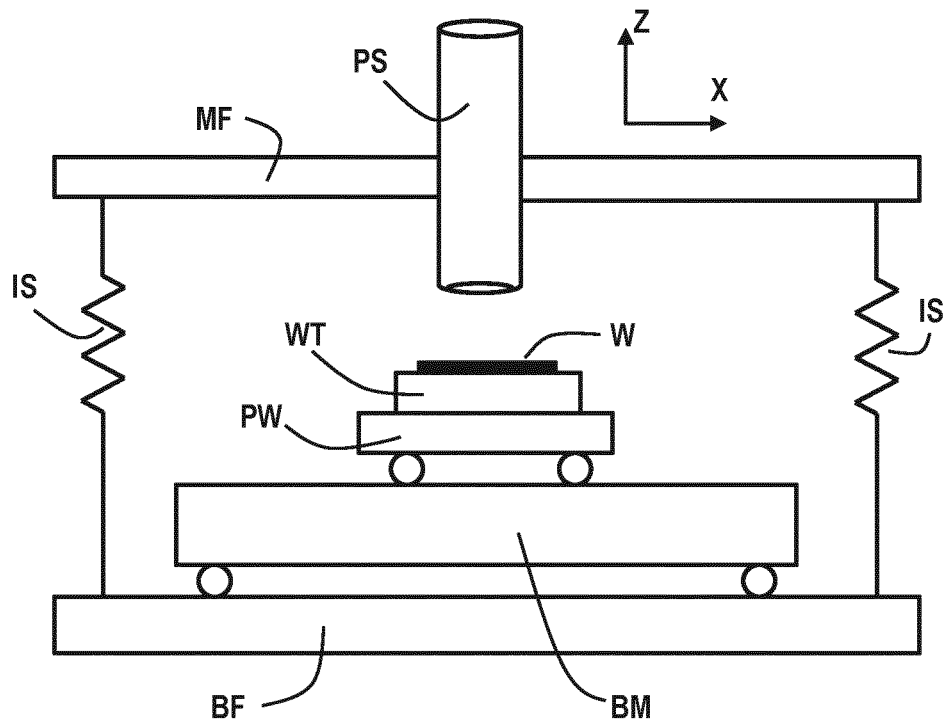
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
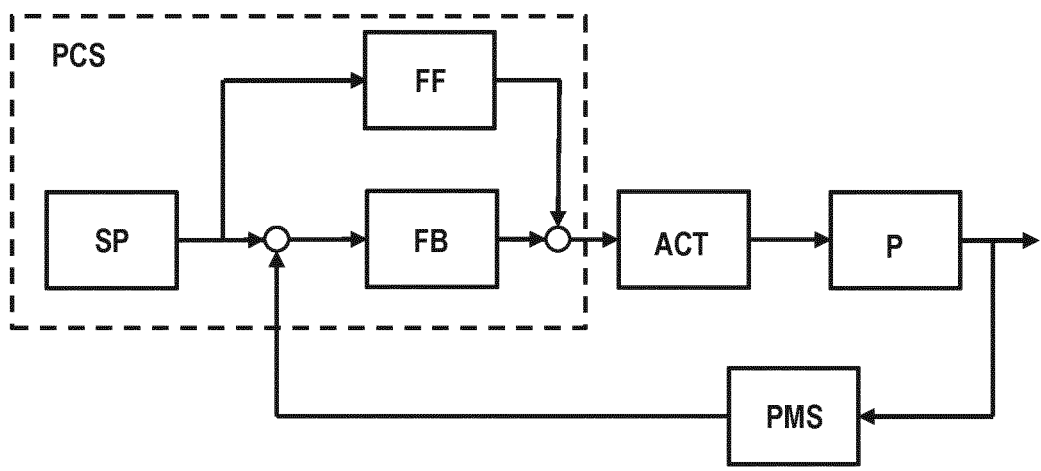
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
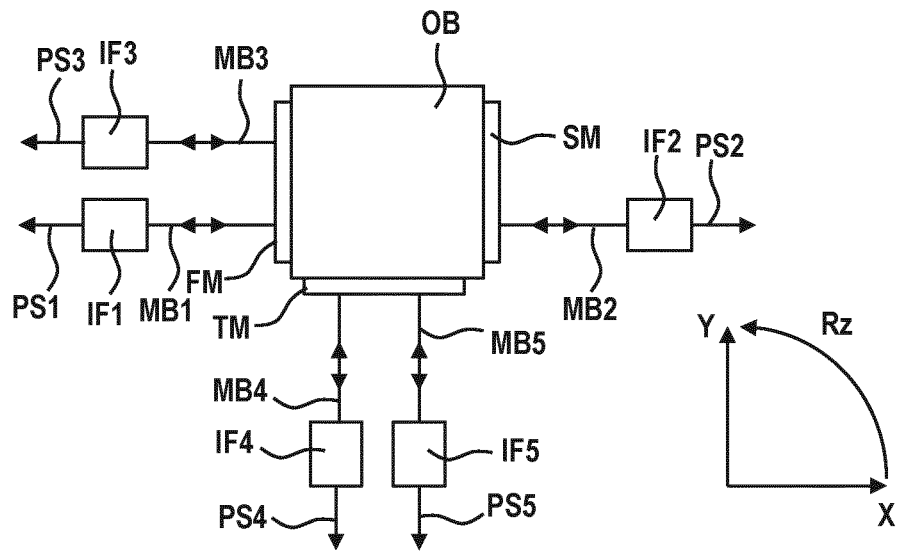
FIG. 4 schematically depicts a top view of an interferometer system.

FIG. 4 schematically depicts a practical embodiment of an interferometer system, e.g. as part of the position measurement system PMS, configured to measure a position of an object OB, wherein the object OB may for instance be the substrate support WT or the mask support MT.

The interferometer system comprises a first interferometer IF1 and a second interferometer IF2. The first interferometer IF1 is arranged to provide a first position signal PS1 representative of a position of the object OB in X-direction by directing a first measurement beam MB1 on a first mirror FM. The second interferometer IF2 is arranged to provide a second position signal PS2 representative of a position of the object OB in X-direction by directing a second measurement beam MB2 on a second mirror SM. The first mirror FM and the second mirror SM are arranged on opposite sides of the object OB and mainly extend in a Y-direction.

In this embodiment, the interferometer also comprises a third interferometer IF3, a fourth interferometer IF4 and a fifth interferometer IF5. The third interferometer IF3 is arranged to provide a third position signal PS3 representative of a position of the object OB in X-direction by directing a third measurement beam MB3 on the first mirror FM. The fourth interferometer IF4 is arranged to provide a fourth position signal PS4 representative of a position of the object OB in Y-direction by directing a fourth measurement beam MB4 on a third mirror TM. The fifth interferometer IF5 is arranged to provide a fifth position signal PS5 representative of a position of the object OB in Y-direction by directing a fifth measurement beam MB5 on the third mirror TM. The third mirror TM mainly extends in the X-direction.

Although not depicted in this FIG. 4, the interferometer system may include an interferometer arranged to provide a position signal representative of a position of the object OB in Z-direction, which Z-direction is perpendicular to both the X- and Y-directions and thus perpendicular to the plane of drawing in FIG. 4, by directing a measurement beam on a mirror.

The interferometers may be single-pass interferometers in which the respective measurement beam is directed only once to the corresponding mirror, reflected back to interfere with a reference beam. However, one or more, but preferably all interferometers may be multi-pass interferometers in which the respective measurement beam is directed more than once to the corresponding mirror. An example of such an interferometer is schematically indicated in FIG. 5A.

Figure 5A:
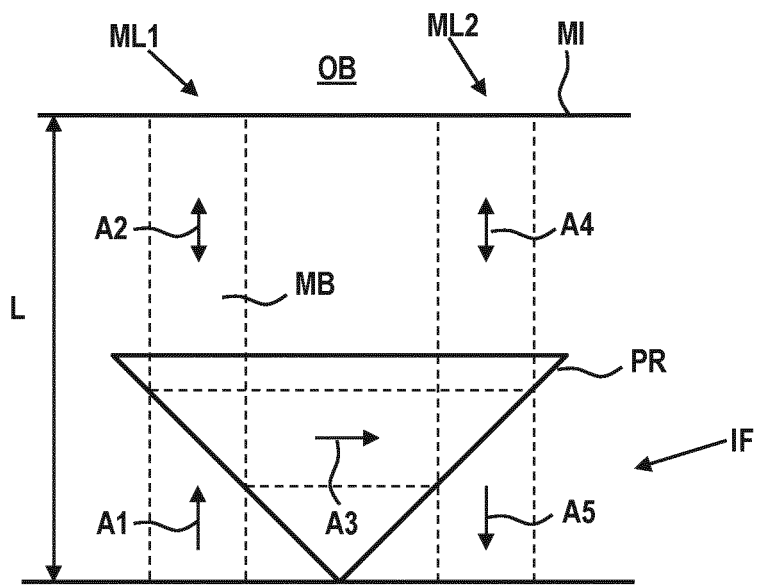
FIG. 5A schematically depicts a multi-pass interferometer.

FIG. 5A schematically depicts an interferometer IF with a beam splitter PR. The interferometer IF is positioned at a distance L from an object OB having a mirror MI. The beam splitter PR is configured to split a beam of radiation into a measurement beam MB and a reference beam. FIG. 5A only depicts the course of the measurement beam MB. The measurement beam MB first propagates towards the mirror MI at the left side of the drawing and is reflected back at a first measurement location ML1 towards the beam splitter PR as indicated by the arrows A1 and A2. The measurement beam MB then propagates to the right side of the beam splitter as indicated by arrow A3 to be directed for a second time towards the mirror MI and be reflected back at a second measurement location ML2 towards the beam splitter PR as indicated by arrow A4. At the beam splitter PR, the measurement beam eventually is directed to be combined with the reference beam as indicated by arrow A5 to form a combined radiation beam containing information about the position of the mirror MI relative to the interferometer IF.

It will be clear for the skilled person that although only two measurement locations are depicted in the embodiment of FIG. 5A, multi-pass interferometers having three, four or more distinct measurement locations may also apply.

The first and second interferometer IF1, IF2 can be used in a method for calibrating the first and/or second mirror of the interferometer system. The method includes the step of generating a first data set comprising the first position signal PS1 and the second position signal PS2 for each of a plurality of positions of the object OB in the Y-direction while the object is in a first rotational orientation and in a first position in the Z-direction. Positioning the object in the plurality of positions in the Y-direction can be done with the aid of the fourth and/or fifth interferometer IF4, IF5 and maintaining the object in the first rotational orientation and in the first position in the Z-direction can be done with the aid of the third, fourth and/or fifth interferometer and one or more sensors measuring the position in Z-direction. However, this may also be done using other sensors.

This first data set provides information about a shape of the first mirror and/or a shape of the second mirror in the Y-direction, but the information is limited to symmetrical shapes only. Hence, the method further includes the step of tilting the object to a second rotational orientation about a rotation axis perpendicular to the X-direction and subsequently generating a second data set comprising the first position signal PS1 and the second position signal PS2 for each of a plurality of positions of the object in the Y-direction while the object is in the second rotational orientation and in the first position in the Z-direction.

The effect of tilting the object OB is that a location where the first measurement beam MB1 of the first interferometer IF1 is incident to the first mirror FM shifts and that the location where the second measurement beam MB2 of the second interferometer IF2 is incident to the second mirror SM also shifts, but in a direction opposite to the shift of the location of the first measurement beam MB1. This shift is already present for single-pass interferometer, but the effect increases for multi-pass interferometer as will be explained by reference to FIG. 5B.

Figure 5B:
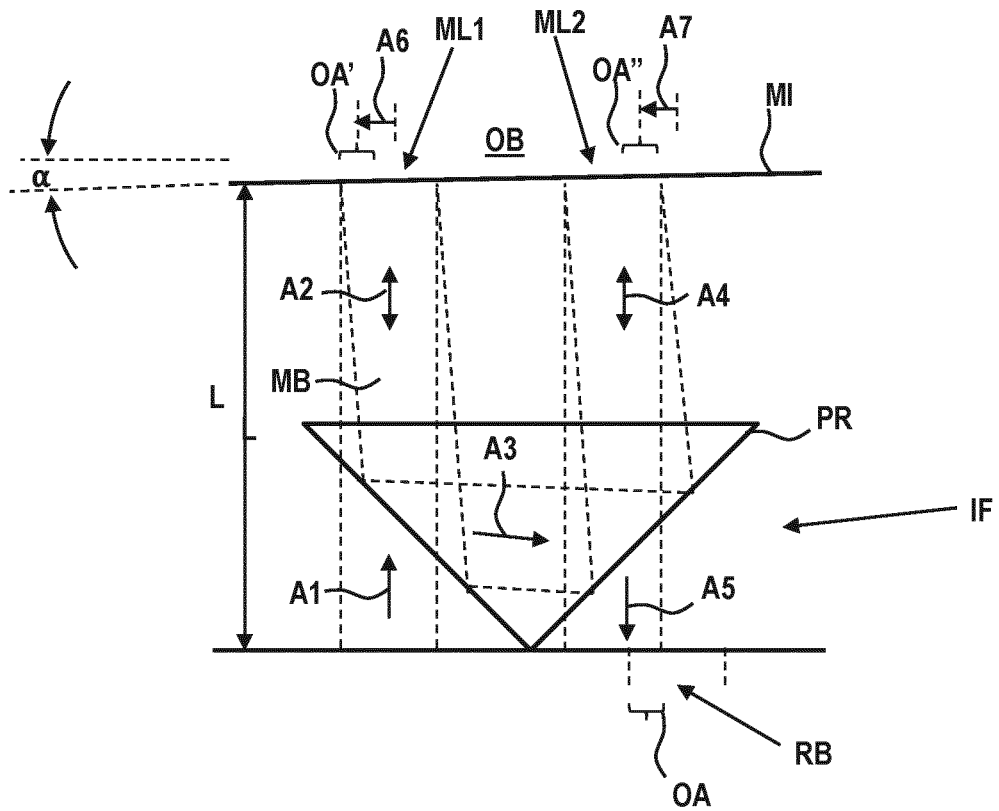
FIG. 5B schematically depicts the multi-pass interferometer of FIG. 5A after tilting the mirror.

FIG. 5B depicts the multi-pass interferometer IF of FIG. 5A with the mirror MI being tilted over an angle α. As a result thereof, the first measurement location ML1 shifts similarly to the measurement beam of a single-pass interferometer as described above. However, the first measurement beam MB after reflecting back at the first measurement location ML1 has been tilted 2α, which results in an additional shift in the second measurement location ML2. In the shown embodiment, the distance between the first and second measurement locations ML1 and ML2 has decreased. Tilting in opposite direction would result in an increase in the distance between the first and second measurement locations ML1, ML2. Due to tilting of the mirror MI, the measurement beam returns to the beam splitter PR at a different location than in FIG. 5A. The location in case of no tilt of the mirror as depicted in FIG. 5A resulting in maximum overlap with the reference beam is indicated in FIG. 5B using reference symbol RB. Due to the measurement beam MB returning at a different location caused by the tilt of the mirror MI, there is only overlap between the measurement beam and the reference beam at the region indicated by reference symbol OA. Tracing back this overlapping portion OA of the measurement beam to the first and second measurement location ML1, ML2 results in an overlapping portion OA' at the first measurement location ML1 and in an overlapping portion OA" at the second measurement location ML2. These overlapping portions OA' and OA" are the portions at the mirror MI that have a contribution to the position signal resulting from the combination of the measurement beam and the reference beam where in FIG. 5A, the entire measurement location ML1 and ML2 have a contribution to the position signal. Hence, besides the shift of the measurement locations itself, there is also a shift in the centre of the overlapping portions as indicated by the arrows A6 and A7.

Hence, the second data set includes information about the shape of the first mirror FM and/or the second mirror SM that is different from the information in the first data set and thereby allows to obtain information about the symmetrical shapes as well as the asymmetrical shapes of the first and/or second mirror and thus to determine the shape of the first mirror and/or the shape of the second mirror in the Y-direction based on the first and second data set.

Determining the shape of the first mirror and/or the shape of the second mirror in the Y-direction based on the first data set and the second data set may comprise comparing a value of the first data set at one of the plurality of positions of the object in the Y-direction with a value of the second data set at the one of the plurality of positions of the object in the Y-direction.

In an embodiment, the rotation axis used to tilt the object about to the second rotational orientation is perpendicular to the X-direction and perpendicular to the Y-direction, i.e. parallel to the Z-direction.

The presence of the third interferometer IF3 in FIG. 4 allows the combination of the first and third interferometer IF1, IF3 to measure a rotation of the object OB about an axis extending parallel to the Z-direction. The rotation of the object OB about said axis extending parallel to the Z-direction can also be measured using the fourth and fifth interferometer IF4, IF5 in this embodiment.

In an embodiment, additional information about the first mirror FM can be obtained by generating a third data set comprising the first position signal PS1 and the third position signal PS3 for each of a plurality of positions of the object in the Y-direction while the object OB is maintained in a constant rotational orientation about said axis parallel to the Z-direction using the fourth and fifth interferometers or any other sensor or sensors other than the first, second and third interferometer, and wherein the third data set is used to determine the shape of the first mirror FM in Y-direction.

Figure 6:
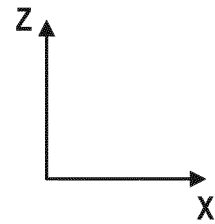
FIG. 6 schematically depicts a side view of the object.
Figure 6:
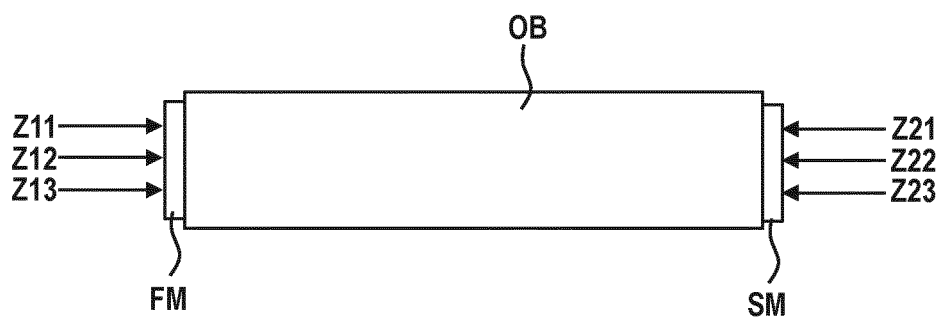

FIG. 6 schematically depicts a side view of the object OB with the first mirror FM and the second mirror SM at opposite sides of the object OB. At the first mirror FM, three height levels Z11, Z12, Z13 in Z-direction have been indicated, while at the second mirror SM, also three height levels Z21, Z22, Z23 in Z-direction have been indicated that correspond to the same height levels at the first mirror FM.

In an embodiment, the above described method is repeated for at least two height levels, preferably all height levels, i.e. two or more of the following combinations:

| First measurement beam | Second measurement beam |
| --- | --- |
| Z11 | Z21 |
| Z12 | Z22 |
| Z13 | Z23 |

In an embodiment, the object OB is tilted about a further rotation axis extending parallel to the Y-direction, i.e. perpendicular to both the X- and Z-direction. This allows the first data set to comprise the first position signal PS1 corresponding to a first position in the Z-direction for each of the plurality of positions of the object in the Y-direction and to comprise the second position signal corresponding to a second position in the Z-direction for each of the plurality of positions of the object in the Y-direction. Hence, measurements are carried out in which the first and second measurement beam are directed to different height levels on the respective mirrors. Possible combinations based on the height levels of FIG. 6 are indicated below:

| First measurement beam | Second measurement beam |
| --- | --- |
| Z11 | Z22 |
| Z11 | Z23 |
| Z12 | Z21 |
| Z12 | Z23 |
| Z13 | Z21 |
| Z13 | Z22 |

It will be clear that for each above described combination of height levels, it is also possible to repeat the measurements for the first rotational orientation and the second rotational orientation, wherein the second rotational orientation is reached by tilting the object from the first rotational orientation about a rotation axis extending in the Z-direction.

Once the shape of the first mirror FM is determined, e.g. using the first interferometer, the information may be stored in a so-called mirror map, which mirror map may be used for the first interferometer IF1 and/or the third interferometer IF3 to compensate for the shape of the first mirror FM. The insight that tilting of the object results in a shift of the measurement locations can be used to determine which data in the mirror map should be used for the compensation. Hence, when measuring a position of an object using the interferometer system, the position of the object in the Y-direction should be measured as well as the rotational position or the rotational orientation of the object about an axis extending parallel to the Z-direction. These two measurements can then be used to determine the position of the measurement locations of the measurement beam on the first mirror FM in the Y-direction. When the position of the object in the X-direction is measured using the first or third interferometer, the mirror map and the determined positions of the measurement locations of the measurement beam on the first mirror can be used to adjust the measured position of the object in the X-direction for the shape of the first mirror.

When the mirror map also includes data representative for the shape of the first mirror in the Z-direction, measurement of the position of the object in the Z-direction may aid in determining the position of the measurement locations and thus which data from the mirror map should be used to adjust the measured position of the object in the X-direction.

Figure 7:
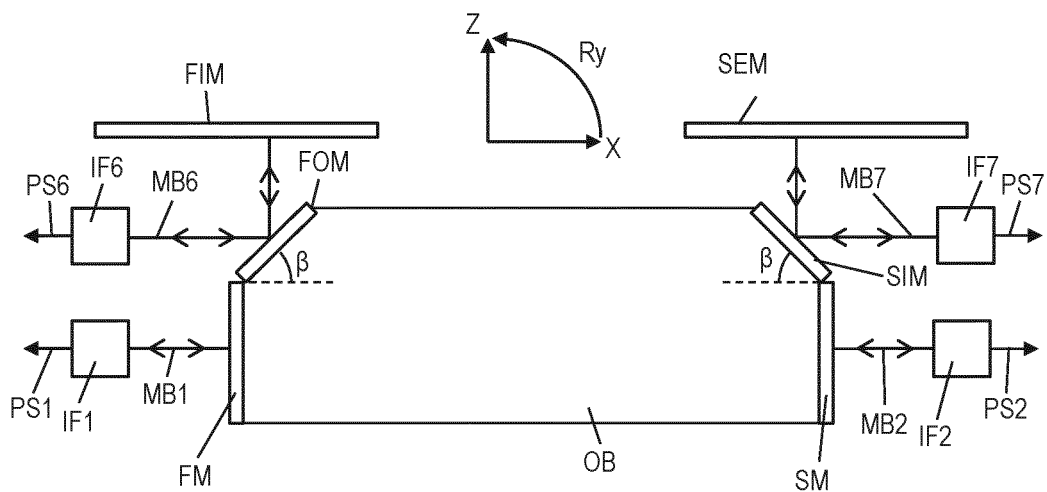
FIG. 7 schematically depicts a side view of the interferometer system of FIG. 4.

FIG. 7 schematically depicts a side view of the interferometer system of FIG. 4. Some elements of the interferometer shown in FIG. 4 are not depicted in FIG. 7 for clarity reasons and vice versa as a result of which the side view or outer contours thereof may differ. Shown in FIG. 7 are the first interferometer IF1 and the second interferometer IF2 with respectively the corresponding first and second measurement beams MB1, MB2 directed to the first and second mirrors FM, SM. Hence, as described above, the first position signal PS1 provided by the first interferometer IF1 is representative for a position of the object in X-direction, and the second position signal PS2 provided by the second interferometer IF2 is also representative for a position of the object in X-direction.

FIG. 7 further depicts a sixth interferometer IF6 and a seventh interferometer IF7. The sixth interferometer IF6 is arranged to provide a sixth position signal PS6 representative of a position of the object OB in both X- and Z-direction by directing a sixth measurement beam MB6 on a fifth mirror FIM via a fourth mirror FOM on the object OB. The seventh interferometer IF7 is arranged to provide a seventh position signal PS7 representative of a position of the object OB in both X- and Z-direction by directing a seventh measurement beam MB7 on a seventh mirror SEM via a sixth mirror SIM on the object OB.

The fifth mirror FIM and the seventh mirror SE are arranged externally of the object OB, e.g. on a measurement frame MF as depicted in FIG. 2, and forms a reference in Z-direction extending mainly in X-direction. The fourth mirror FOM and the sixth mirror SIM are arranged on the object OB and extend mainly in Y-direction while making an angle β with the X-direction, where β is preferably 45 degrees. Hence, the sixth and seventh measurement beams MB6, MB7 are initially emitted by their respective sixth and seventh interferometer in X-direction towards the fourth and sixth mirror FOM, SIM, respectively. The fourth and sixth mirror FOM, SIM will deflect the sixth and seventh measurement beam MB6, MB7 towards the fifth and seventh mirror FIM, SEM, where the sixth and seventh measurement beam MB6, MB7 are reflected back towards the fourth and sixth mirror FOM, SIM. The fourth and sixth mirror FOM, SIM will then deflect the sixth and seventh measurement beam MB6, MB7 back towards the sixth and seventh interferometer IF6, IF7, respectively. The sixth and seventh interferometer IF6, IF7, may be multipass interferometers in which case the sixth and seventh measurement beam may follow the above described optical path multiple times.

Due to the sixth and seventh measurement beams MB6, MB7 travelling in both X- and Z-direction, a corresponding optical path lengths and thus the respective position signals PS6, PS7 are dependent on the position of the object in both X- and Z-direction. To obtain a signal representative of the position of the object in Z-direction only, the first position signal PS1 containing only information about the X-direction may be subtracted from the sixth position signal PS6, yielding PSZ1=PS6−PS1. Similar, the second position signal PS2 may be subtracted from the seventh position signal PS7, yielding PSZ2=PS7−PS2. Position signals PSZ1 and PSZ2 are now representative for the position of the object in Z-direction.

Although the position signals PSZ1 and PSZ2 are here depicted as being formed by two different position signals from two separate interferometers, it is also possible that these position signals are formed by using a single interferometer, wherein a reference beam is incident on a mirror extending in Y-direction and Z-direction, wherein a measurement beam is incident on a mirror extending in Y-direction and making an angle with the X-direction, and wherein the measurement beam and reference beam are allowed to interfere with each other in the interferometer thereby automatically subtracting position information in the X-direction from position information in both the X- and Z-direction yielding a single position signal that is representative for the position of the object in Z-direction.

As can be seen in FIG. 7, each position signal PSZ1, PSZ2 is dependent on a shape and orientation of three imperfect mirrors, so that calibration of all mirrors may be necessary. This may be carried out by generating data sets using different mutual relationships between the measurement locations on the respective mirrors.

To calibrate the mirrors, position measurements in different positions in X-direction, different positions in Y-direction, different positions in Z-direction, different rotational orientations about a rotation axis parallel to the Z-direction, and in different rotational orientations about a rotation axis parallel to the Y-direction are used to generate different data sets such that each measurement location on one mirror is combined with different measurement locations on other mirrors thereby allowing to determine local shapes of mirrors or combination of mirrors and to use the combination of data sets to determine the global shapes of the mirrors.

In an example, a first data set is generated comprising at least two position signals corresponding to mirrors to be calibrated, e.g. the first position signal PS1, the second position signal PS2, the sixth position signal PS6, and the seventh position signal PS7 for each of a plurality of positions of the object in the Y-direction while the object is in a first rotational orientation and in a first position in a Z-direction and in an X-direction. Hence, all six degrees are preferably fixed while the position in Y-direction is varied.

Further, a second data set is generated comprising the same position signals while varying the position in Y-direction again. A main difference between the first and second data set is that the object has a different rotational orientation, namely a second rotational orientation, in which the object has tilted about a rotation axis perpendicular to the X-direction compared to the first rotational orientation. This rotation axis may thus be parallel to the Y-direction or the Z-direction.

Additional data sets may be generated comprising the same position signals while varying the position in Y-direction again. These additional data sets may be separate data sets, but may also be extensions of the first and/or second data set. Each additional data set may have a different position in X, Y and/or Z and/or a different rotational orientation. Generating data sets while varying the position of the object in Y-direction is advantageous for obtaining information about a mirror shape in Y-direction. However, the same variation in position may also be applied in other directions, e.g. in X-direction for the fifth and seventh mirrors that mainly extend in X-direction and e.g. in Z-direction for instance the first, second, fourth and sixth mirrors.

Figure 8A:
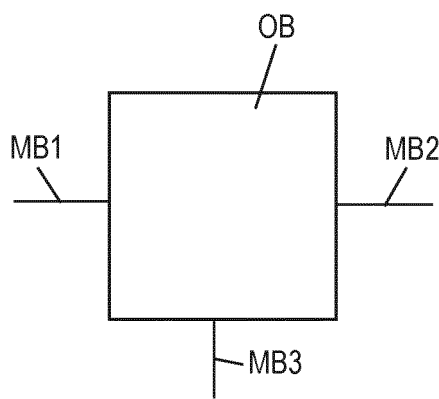
FIG. 8A schematically depicts a top view of a simplified interferometer system in a first rotational position.
Figure 8B:
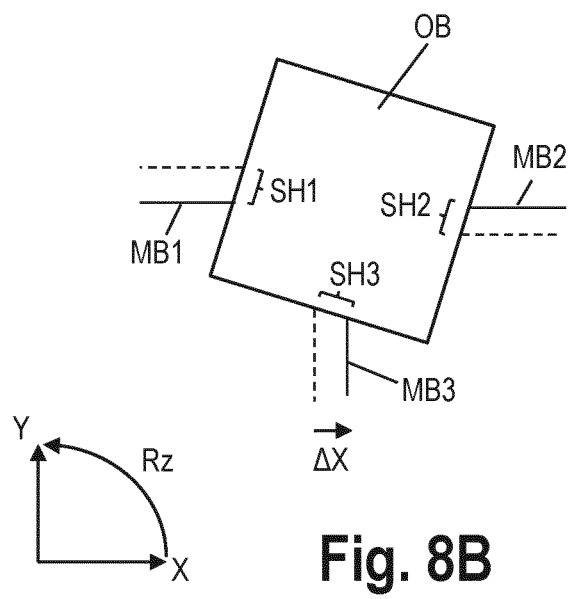
FIG. 8B schematically depicts a top view of the simplified interferometer system in a second rotational position.

FIGS. 8A and 8B depict a simplified top view of an interferometer system. Shown is an object OB to which three measurement beams are directed to measure a position of the object OB. A first measurement beam MB1 and a second measurement beam MB2 extend in X-direction and hit the object at opposite sides. A third measurement beam MB3 extends in Y-direction. FIG. 8A relates to a first rotational orientation of the object OB. FIG. 8B relates to a second rotational orientation of the object while maintaining the position of the object OB. Compared to the first rotational orientation shown in FIG. 8A, the object has tilted clockwise about a rotation axis parallel to the Z-direction, referred to as an Rz rotation. As a result thereof, the first, second and third measurement beams MB1, MB2, MB3 hit the object OB at different locations. This shift in location is indicated as SH1, SH2, SH3. For the first and second measurement beams MB1, MB2, this shift is in opposite direction and this different characteristic is used to obtain a different data set. However, when varying the position of the object in Y-direction, use is made of the third measurement beam MB3 which also has undergone a shift SH3 over the object. Hence, it may be beneficial to not only tilt the object B about the rotation axis parallel to the Z-direction, but also translate the object in the X-direction over a distance ΔX corresponding to the shift SH3, so that the third measurement beam MB3 hits the object OB at the same location for the data set generated in the first rotational orientation and the data set generated in the second rotational orientation.

The different data sets generated using different calibration measurements may be input to a linear least squares model to find the mirror shape of the desired mirrors. In this linear least squares system, it is assumed that so-called pitch errors, e.g. resulting from mechanical mounting offsets and internal imperfections in the optics of the interferometers, i.e. deviations, in particular translation errors of the measurement beams, in the intended position of the measurement beams, are zero. However, in practice these pitch errors are non-zero and may decrease the reconstruction capabilities of the linear least squares system. In an embodiment, it is proposed to incorporate the linear system into a non-linear least squares solver. For each iteration, a value for the pitch errors is determined, resulting in an update of the linear system. After a few iterations the pitch errors should converge and the iteration can be stopped to solve the linear system. The non-linear system may be simplified by taking only the pitch errors into account that have a significant contribution to the reconstruction of the mirror shape.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Clauses

1. A method for calibrating a mirror of an interferometer system configured to measure a position of an object, which interferometer system includes a first interferometer and a second interferometer, wherein the first interferometer is arranged to provide a first position signal representative of a position of the object in X-direction by directing a first measurement beam on a first mirror, wherein the second interferometer is arranged to provide a second position signal representative of the position of the object in X-direction by directing a second measurement beam on a second mirror, wherein the first mirror and the second mirror are arranged on opposite sides of the object and mainly extend in a Y-direction, wherein the method comprises the following steps:
   a. generating a first data set comprising the first position signal and the second position signal for each of a plurality of positions of the object in the Y-direction while the object is in a first rotational orientation and in a first position in a Z-direction;
b. tilting the object to a second rotational orientation about a rotation axis perpendicular to the X-direction;
c. generating a second data set comprising the first position signal and the second position signal for each of a plurality of positions of the object in the Y-direction while the object is in the second rotational orientation and in the first position in the Z-direction; and
d. determining a shape of the first mirror and/or a shape of the second mirror in the Y-direction based on the first data set and the second data set.

2. The method according to clause 1, wherein at least one of the first and second interferometer is a multi-pass interferometer.

3. The method according to clause 1 or 2, wherein step d. comprises comparing a value of the first data set at one of the plurality of positions of the object in the Y-direction with a value of the second data set at the one of the plurality of positions of the object in the Y-direction.

4. The method according to any of clauses 1-3, wherein the rotation axis perpendicular to the X-direction is perpendicular to the Y-direction.

5. The method according to any of clauses 1-3, wherein the rotation axis perpendicular to the X-direction is parallel to the Y-direction.

6. The method according to clause 4, wherein the steps prior to step d. are repeated for a second position of the object in Z-direction, such that the first data set also comprises the first position signal and the second position signal for each of the plurality of positions of the object in the Y-direction while the object is in the first rotational orientation and in the second position, and such that the second data set also comprises the first position signal and the second position signal for each of the plurality of positions of the object in the Y-direction while the object is in the second rotational orientation and in the second position, and wherein in step d. the first data set and the second data set are further used to determine a shape of the first mirror and/or the second mirror in Z-direction.

7. The method according to clause 6, wherein the method further comprises the steps of:
tilting the object about a further rotation axis extending parallel to the Y-direction; and
repeating the steps prior to step d, such that the first data set also comprises the first position signal corresponding to the first position in the Z-direction for each of the plurality of positions of the object in the Y-direction and the second position signal corresponding to the second position in the Z-direction for each of the plurality of positions of the object in the Y-direction while the object is in the first rotational orientation, and such that the second data set also comprises the first position signal corresponding to the first position in the Z-direction for each of the plurality of positions of the object in the Y-direction and the second position signal corresponding to the second position in the Z-direction for each of the plurality of positions of the object in the Y-direction while the object is in the second rotational orientation.

8. The method according to any of the clauses 1-7, wherein the interferometer system includes a third interferometer, wherein the third interferometer is arranged to provide a third position signal representative of the position of the object in X-direction by directing a third measurement beam on the first mirror, wherein the combination of the first and the third interferometer allows to measure a rotation of the object about an axis extending parallel to the Z-direction, and wherein the method prior to step d. comprises the following step of generating a third data set comprising the first position signal and the third position signal for each of a plurality of positions of the object in the Y-direction while the object is maintained in a constant rotational orientation about said axis parallel to the Z-direction using other sensors than the first, second and third interferometer, and wherein in step d. the third data set is used to determine the shape of the first mirror in Y-direction.

9. A method for measuring a position of an object using an interferometer system including a first interferometer, the first interferometer being a multi-pass interferometer having a first optical system and a first mirror, wherein the first optical system is configured to direct a first measurement beam towards the first mirror such that the first measurement beam is incident to the first mirror at at least two distinct measurement locations, wherein the first mirror is arranged on the object and mainly extends in a Y-direction to allow the first interferometer to measure a position of the object in an X-direction perpendicular to the Y-direction, wherein the method makes use of a mirror map including data representative for the shape of the first mirror in the Y-direction, and wherein the method comprises the following steps:
a. measuring a position of the object in the Y-direction;
b. measuring a rotational position of the object about an axis extending parallel to a Z-direction, which Z-direction is perpendicular to both the X-direction and the Y-direction;
c. using the measured position in the Y-direction and the measured rotational position about the axis parallel to the Z-direction to determine the position of the at least two distinct measurement locations of the first measurement beam on the first mirror in the Y-direction;
d. measuring a position of the object in the X-direction; and
e. using the mirror map and the determined positions of the at least two distinct measurement locations to adjust the measured position of the object in the X-direction for the shape of the first mirror.

10. The method according to clause 9. wherein the interferometer includes a second interferometer, the second interferometer being a multi-pass interferometer having a second optical system and a second mirror, wherein the second optical system is configured to direct a second measurement beam towards the second mirror such that the second measurement beam is incident to the second mirror at at least two distinct measurement locations, wherein the second mirror is arranged on the object at a side opposite to the first mirror and mainly extends in the Y-direction to allow the second interferometer to measure a position of the object in the X-direction, and wherein the mirror map is obtained using a method according to any of clauses 1-4.

11. The method according to clause 9 or 10, wherein the mirror map includes data representative for the shape of the first mirror in the Z-direction, and wherein the method prior to step e. includes the following steps:
measuring a position of the object in the Z-direction;
measuring a rotational position of the object about an axis extending parallel to the Y-direction; and
using the measured position in the Z-direction and the measured rotational position about the axis parallel to the Y-direction to determine the position of the at least two distinct measurement locations of the first measurement beam on the first mirror in the Z-direction.

12. The method according to clause 11, wherein the mirror map is obtained using a method according to clause 6 or 7.

13. A lithographic apparatus comprising:
an object to be positioned;
an actuator system to position the object;
a measurement system including an interferometer system, which interferometer system includes a first interferometer and a second interferometer, wherein the first interferometer is arranged to provide a first position signal representative of a position of the object in X-direction by directing a first measurement beam on a first mirror, wherein the second interferometer is arranged to provide a second position signal representative of the position of the object in X-direction by directing a second measurement beam on a second mirror, wherein the first mirror and the second mirror are arranged on opposite sides of the object and mainly extend in a Y-direction; and
a control system to drive the actuator system based on an output of the measurement system,
wherein the control system is configured to carry out the method according to any of the clauses 1-8.

14. The lithographic apparatus according to clause 13, further comprising:
an illumination system configured to condition a radiation beam;
a support constructed to support a patterning device, the patterning device being capable of imparting the radiation with a pattern in its cross-section to form a patterned radiation beam;
a substrate table constructed to hold a substrate; and
a projection system configured to project the patterned radiation beam onto a target portion of the substrate,
wherein the object is the support or the substrate table.

15. A device manufacturing method wherein use is made of a lithographic apparatus according to clause 13 or 14.

The invention claimed is:

1. A method for calibrating a mirror of an interferometer system configured to measure a position of an object, which interferometer system includes a first interferometer and a second interferometer, wherein the first interferometer is arranged to provide a first position signal representative of a position of the object in a X-direction by directing a first measurement beam on a first mirror, wherein the second interferometer is arranged to provide a second position signal representative of the position of the object in the X-direction by directing a second measurement beam on a second mirror, and wherein the first mirror and the second mirror are arranged on opposite sides of the object and extend in a Y-direction, wherein the method comprises
   a. generating a first data set comprising the first position signal and the second position signal for each of a plurality of positions of the object in the Y-direction while the object is in a first rotational orientation and in a first position in a Z-direction;
   b. tilting the object to a second rotational orientation about a rotation axis perpendicular to the X-direction;
   c. generating a second data set comprising the first position signal and the second position signal for each of a plurality of positions of the object in the Y-direction while the object is in the second rotational orientation and in the first position in the Z-direction; and
   d. determining a shape of the first mirror and/or a shape of the second mirror in the Y-direction based on the first data set and the second data set.

2. The method according to claim 1, wherein for step a., the plurality of positions of the object in the Y-direction results in a first pairing configuration in the first data set between measurement locations on the first mirror and measurement locations on the second mirror, and wherein for step c., the second data set comprises a second pairing configuration between measurement locations on the first mirror and measurement locations on the second mirror, which second pairing configuration is different from the first pairing configuration.

3. The method according to claim 2, wherein the plurality of positions of the object in the Y-direction used in step c. is chosen such that the second data set comprises measurement locations on the first and second mirrors that are also in the first data set.

4. The method according to claim 1, wherein the first and/or second interferometer is a multi-pass interferometer.

5. The method according to claim 1, wherein step d. comprises comparing a value of the first data set at one of the plurality of positions of the object in the Y-direction with a value of the second data set at the one of the plurality of positions of the object in the Y-direction.

6. The method according to claim 1, wherein step d. comprises solving a linear least squares system built from the first data set and the second data set.

7. The method according to claim 6, wherein the linear least squares system is incorporated into a non-linear least squares solver, wherein for each iteration, a value for a pitch error of the first and/or second interferometer is determined resulting in an update of the linear least squares system, and wherein the linear least squares system is solved once the pitch error values converge.

8. The method according to claim 1, wherein step b. includes a translation of the object to compensate for a shift in measurement location of a position sensor other than the first and second interferometers caused by the tilting of the object to the second rotational orientation.

9. The method according to claim 1, wherein the rotation axis perpendicular to the X-direction is perpendicular to the Y-direction.

10. The method according to claim 9, wherein the steps a., b., and c. are repeated for a second position of the object in the Z-direction, such that the first data set also comprises the first position signal and the second position signal for each of the plurality of positions of the object in the Y-direction while the object is in the first rotational orientation and in the second position, and such that the second data set also comprises the first position signal and the second position signal for each of the plurality of positions of the object in the Y-direction while the object is in the second rotational orientation and in the second position, and wherein in step d. the first data set and the second data set are further used to determine a shape of the first mirror and/or the second mirror in the Z-direction.

11. The method according to claim 10, further comprising:
   tilting the object about a further rotation axis extending parallel to the Y-direction; and
   repeating steps a., b. and c., such that the first data set also comprises the first position signal corresponding to the first position in the Z-direction for each of the plurality of positions of the object in the Y-direction and the second position signal corresponding to the second position in the Z-direction for each of the plurality of positions of the object in the Y-direction while the object is in the first rotational orientation, and such that the second data set also comprises the first position signal corresponding to the first position in the Z-direction for each of the plurality of positions of the object in the Y-direction and the second position signal corresponding to the second position in the Z-direction for each of the plurality of positions of the object in the Y-direction while the object is in the second rotational orientation.

12. The method according to claim 1, wherein the rotation axis perpendicular to the X-direction is parallel to the Y-direction.

13. The method according to claim 1, wherein the interferometer system includes a third interferometer, wherein the third interferometer is arranged to provide a third position signal representative of the position of the object in the X-direction by directing a third measurement beam on the first mirror, wherein the combination of the first and third interferometers allows measurement of a rotation of the object about an axis extending parallel to the Z-direction, and further comprising et generating a third data set comprising the first position signal and the third position signal for each of a plurality of positions of the object in the Y-direction while the object is maintained in a constant rotational orientation about the axis parallel to the Z-direction using a sensor other than the first, second and third interferometers, and wherein in step d. the third data set is used to determine the shape of the first mirror in Y-direction.

14. The method according to claim 1, wherein the interferometer system includes a further interferometer, wherein the further interferometer is arranged to provide a further position signal representative of the position of the object in both X- and Z-directions by directing a further measurement beam via a further mirror on the object to an external mirror, wherein the further mirror on the object extends in the Y-direction and makes a non-zero angle with both the X- and Y-directions, wherein the further mirror is calibrated along with the first mirror for the purpose of increasing an accuracy of position measurements in the Z-direction obtained using the further position signal and the first position signal.

15. A lithographic apparatus comprising:
an object to be positioned;
an actuator system to position the object;
a measurement system including an interferometer system, which interferometer system includes a first interferometer and a second interferometer, wherein the first interferometer is arranged to provide a first position signal representative of a position of the object in X-direction by directing a first measurement beam on a first mirror, wherein the second interferometer is arranged to provide a second position signal representative of the position of the object in X-direction by directing a second measurement beam on a second mirror, wherein the first mirror and the second mirror are arranged on opposite sides of the object and mainly extend in a Y-direction; and
a control system to drive the actuator system based on an output of the measurement system,
wherein the control system is configured to carry out the method according to claim 1.

16. The lithographic apparatus according to claim 15, further comprising:
an illumination system configured to condition a radiation beam;
a support constructed to support a patterning device, the patterning device being capable of imparting the radiation with a pattern in its cross-section to form a patterned radiation beam;
a substrate table constructed to hold a substrate; and
a projection system configured to project the patterned radiation beam onto a target portion of the substrate,
wherein the object is the support or the substrate table.

17. A device manufacturing method wherein use is made of the lithographic apparatus according to claim 15.

18. A non-transitory computer-readable medium having instruction therein, the instructions, when executed by a machine, configured to cause the machine to cause execution of the method of claim 1.

19. A method for measuring a position of an object using an interferometer system including a first interferometer and a second interferometer, the first interferometer being a multi-pass interferometer having a first optical system and a first mirror, wherein the first optical system is configured to direct a first measurement beam towards the first mirror such that the first measurement beam is incident to the first mirror at at least two distinct measurement locations, wherein the first mirror is arranged on the object and mainly extends in a Y-direction to allow the first interferometer to measure a position of the object in an X-direction perpendicular to the Y-direction, the second interferometer being a multi-pass interferometer having a second optical system and a second mirror, wherein the second optical system is configured to direct a second measurement beam towards the second mirror such that the second measurement beam is incident to the second mirror at at least two distinct measurement locations, wherein the second mirror is arranged on the object at a side opposite to the first mirror and mainly extends in the Y-direction to allow the second interferometer to measure a position of the object in the X-direction, wherein the method makes use of a mirror map including data representative for the shape of the first mirror in the Y-direction, and wherein the method comprises:
a. measuring a position of the object in the Y-direction using one or more sensors;
b. measuring a rotational position of the object about an axis extending parallel to a Z-direction using the one or more sensors, which Z-direction is perpendicular to both the X-direction and the Y-direction;
c. using the measured position in the Y-direction and the measured rotational position about the axis parallel to the Z-direction to determine the position of the at least two distinct measurement locations of the first measurement beam on the first mirror in the Y-direction;
d. measuring a position of the object in the X-direction using the interferometer system; and
e. using the mirror map and the determined positions of the at least two distinct measurement locations to adjust the measured position of the object in the X-direction for the shape of the first mirror.

20. The method according to claim 19, wherein the mirror map includes data representative for the shape of the first mirror in the Z-direction, and wherein the method further comprises:
measuring a position of the object in the Z-direction;
measuring a rotational position of the object about an axis extending parallel to the Y-direction; and
using the measured position in the Z-direction and the measured rotational position about the axis parallel to the Y-direction to determine the position of the at least two distinct measurement locations of the first measurement beam on the first mirror in the Z-direction.

* * * * *